(12) United States Patent
Kamikawa et al.

(10) Patent No.: US 6,394,110 B2
(45) Date of Patent: May 28, 2002

(54) SUBSTRATE PROCESSING APPARATUS AND SUBSTRATE PROCESSING METHOD

(75) Inventors: Yuji Kamikawa; Shigenori Kitahara, both of Tosu; Kinya Ueno, Nirasaki, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/912,964

(22) Filed: Jul. 25, 2001

Related U.S. Application Data

(62) Division of application No. 09/735,150, filed on Dec. 12, 2000, now Pat. No. 6,299,696.

(30) Foreign Application Priority Data

Dec. 14, 1999 (JP) .............................. 11-354785

(51) Int. Cl.$^7$ .............................................. B08B 7/04
(52) U.S. Cl. ...................................... 134/61; 134/902
(58) Field of Search .......................... 134/2, 3, 19, 26, 134/28, 29, 30, 31, 32, 34, 35, 36, 41, 902, 61, 95.2, 95.3

(56) References Cited

U.S. PATENT DOCUMENTS

| | | |
|---|---|---|
| 5,485,644 A | 1/1996 | Shinbara et al. |
| 5,503,708 A | 4/1996 | Koizumi et al. |
| 6,001,191 A | 12/1999 | Kamikawa et al. |
| 6,045,624 A | 4/2000 | Kamikawa et al. |
| 6,050,275 A | 4/2000 | Kamikawa et al. |
| 6,068,002 A | 5/2000 | Kamikawa et al. |
| 6,146,467 A | 11/2000 | Takaishi et al. |
| 6,158,141 A | 12/2000 | Asada et al. |
| 6,158,449 A | 12/2000 | Kamikawa |
| 6,164,297 A | 12/2000 | Kamikawa |
| 6,165,279 A | 12/2000 | Tsao et al. |

*Primary Examiner*—Philip Coe
(74) *Attorney, Agent, or Firm*—Morrison & Foerster LLP

(57) ABSTRACT

A substrate processing apparatus (1) for processing wafers (W) has a first processing chamber (2) capable of containing the wafers (W) and a second processing chamber (4) capable of containing the wafers (W). The second processing chamber (4) is formed below and near the first processing chamber (2) and is capable of communicating with the first processing chamber (2). A wafer guide (6) carries the wafers (W) vertically between the first and second processing chambers (2, 4). A shutter (7) is opened to allow the first and second processing chambers (2, 4) to communicate with each other and is closed to isolate the same from each other. A steam supply system (8) including steam supply port, an ozone gas supply system (9) including ozone gas supply port and an IPA supply system (10) including IPA supply port are combined with the first processing chamber (2). A pure water supply system (11) including pure water supply port and a draining unit (12) including a drain pipe-line (141) through which pure water is drained are combined with the second processing chamber (4).

17 Claims, 11 Drawing Sheets

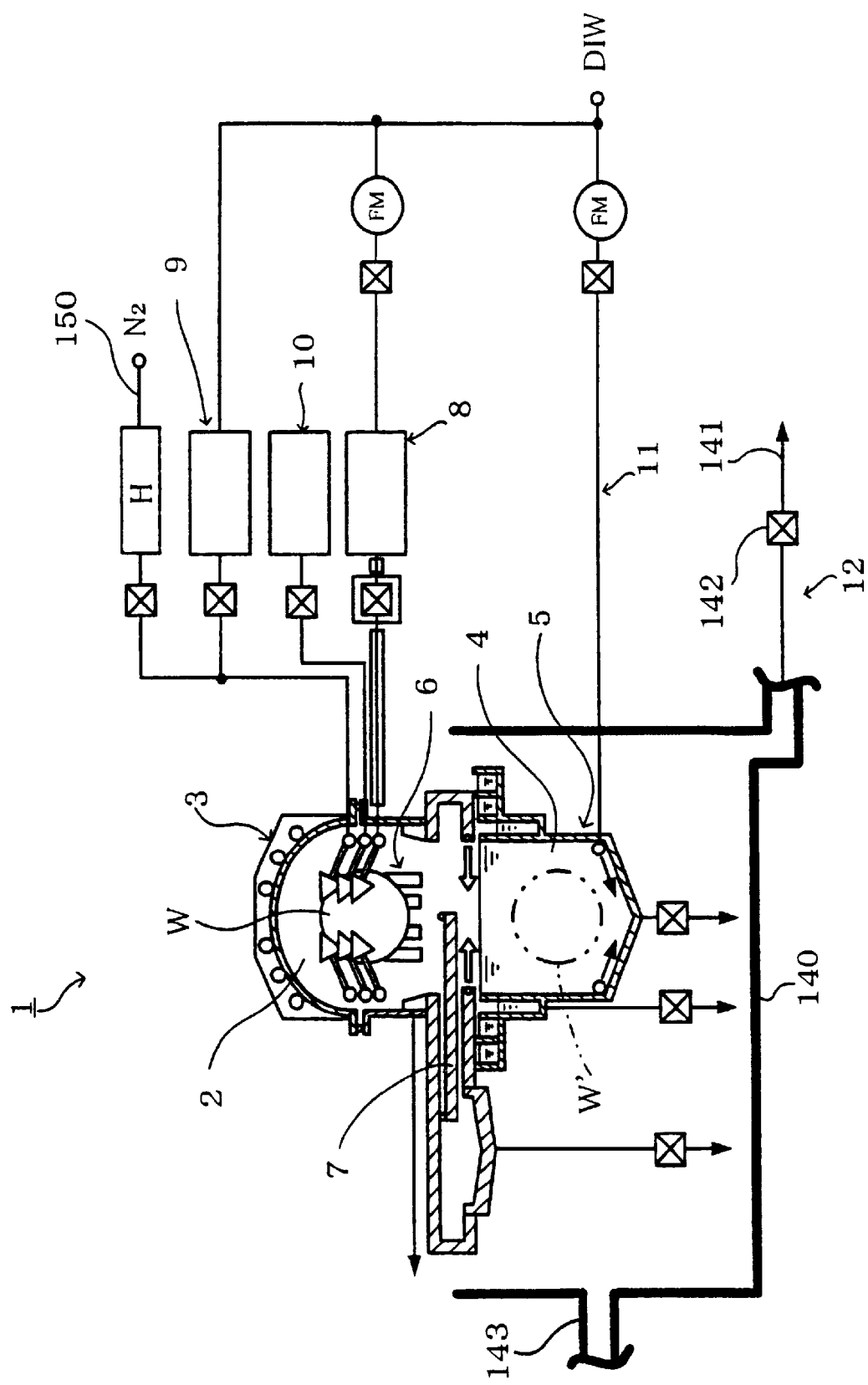
F I G. 1

SUBSTRATE PROCESSING APPARATUS AND SUBSTRATE PROCESSING METHOD

This application is a division of application Ser. No. 09/735,150, filed Dec. 12, 2000, and now Pat. No. 6,299,696.

BACKGROUND OF THE INVENTION

1. Field of the Invention

The present invention relates to a substrate processing apparatus and method for processing substrates, such as semiconductor wafers by a plurality of processes including a cleaning process and drying process.

2. Description of the Related Art

A semiconductor device fabricating process employs a processing apparatus that cleans substrates, such as semiconductor wafers (hereinafter referred to simply as "wafers") to remove a resist film formed on the wafers for a photolithographic process, and contaminants adhering to the wafers, such as particles organic substances and metallic impurities, from the wafers. Widely known conventional processing apparatuses of this type are of batch processing systems that clean and dry a plurality of wafers in a batch.

Such a processing apparatus is provided with a wafer processing unit, a rinsing unit and a wafer drying unit. The wafer processing unit processes wafers by supplying process gases and steam into a processing chamber. The rinsing unit immerses wafers in pure water contained in a cleaning tank for rinsing (rinsing process). The wafer drying unit dries wafers by supplying isopropyl alcohol (hereinafter abbreviated to "IPA") into a drying chamber. Processed wafers are subjected sequentially to a rinsing process and a drying process.

An ozone-assisted process is carried out for altering resist films formed on wafers by using, for example, ozone gas ($O_3$ gas) and steam into water-soluble films that can be easily removed from the wafers by a subsequent rinsing process. A hydrofluoric acid cleaning process for removing an natural oxide film and contaminants from wafers uses hydrofluoric acid vapor (HF vapor). When carrying out a plurality of wafer processing processes by a single wafer processing apparatus, a wafer processing unit and a rinsing unit are used for each of the plurality of wafer processing processes, and the plurality of wafer processing processes and rinsing processes are carried out alternately.

However, since the conventional wafer processing apparatus is provided with an individual wafer processing unit, an individual rinsing unit and an individual wafer drying unit, the wafer processing apparatus is large. When carrying out a plurality of processes by a plurality of processing units included in a single processing apparatus, the processing apparatus must be provided with a plurality of wafer processing units and a plurality of rinsing units. Consequently, the processing apparatus needs a large floor space for installation. Wafers processed by a process using a mixture of a processing gas and steam are carried to a rinsing unit. While the wafers are being carried to the rinsing unit, the wafers are exposed to the atmosphere, which is undesirably because the exposure of the wafers to the atmosphere the possibility of formation of a natural oxide film on the wafers. If carrying the wafers to the rinsing unit takes a long time, reaction products produced on the wafers by the process using the mixture of the processing gas and steam and deteriorated films formed on the wafers are changed into different matters when the same are exposed to the atmosphere. Consequently, it is possible that the reaction products and films which are expected to be easily rinsed off the wafers by a subsequent rinsing process are hardened or become insoluble and remain as contaminants on the wafers.

SUMMARY OF THE INVENTION

Accordingly, it is an object of the present invention to provide a substrate processing apparatus small in size and capable of preventing exposure of processed substrates to the atmosphere and to provide a substrate processing method in connection with the apparatus.

To achieve the object, according to one aspect of the present invention, there is provided a substrate processing apparatus for processing a substrate by a plurality of processes, comprising: a first processing chamber for containing a substrate; a second processing chamber for containing the substrate, adjoining the first processing chamber and capable of communicating with the first processing chamber; a supporting member for supporting the substrate so as to carry the substrate between the first processing chamber and the second processing chamber; a solvent vapor supply port through which solvent vapor is supplied into the first processing chamber; a processing gas supply port through which a processing gas is supplied into the first processing chamber; a drying gas supply port through which a drying gas is supplied into the first processing chamber; and a processing liquid supply port through which a processing liquid is supplied into the second processing chamber.

First, the substrate is placed in the first processing chamber when processing the substrate by this substrate processing apparatus. A solvent vapor is supplied through the solvent vapor supply port into the first processing chamber and a processing gas is supplied through the processing gas supply port into the first processing chamber to process the substrate. After the substrate has been processed, the supporting member carries the substrate from the first processing chamber into the second processing chamber. Then, a processing liquid is supplied through the processing liquid supply port into the second processing chamber to process the substrate with the processing liquid. Then, the supporting member carries the substrate from the second processing chamber into the first processing chamber. Then, a drying gas is supplied through the drying gas supply port into the first processing chamber to dry the substrate by a drying process.

Since the process using the processing gas and the solvent vapor, the process using the processing liquid and the drying process are carried out in the first and second processing chambers adjoining each other and capable of communicating with each other, the substrate processing apparatus can be formed in a small size. Since the substrate are not taken out of the processing apparatus during all the processes, the exposure of the substrate, which has been processed by the process using the processing gas and the solvent vapor, to the atmosphere can be prevented.

Since the first and second processing chambers adjoin each other, the substrate can be quickly carried from the first processing chamber to the second processing chamber, can be processed with the processing liquid immediately after the process using the processing gas and the solvent vapor, and can be processed with the drying gas immediately after the process using the processing liquid. Accordingly, the formation of the natural oxide film on the substrate, and the change of reaction products formed and altered on the substrate into different matters can be prevented. Then, processes can be properly carried out and the throughput of the processes can be improved.

Possible processing gases to be supplied through the processing gas supply port include gases containing reactive species (radicals, ions), such as ozone gas, chlorine gas fluorine gas and the like.

For example, the solvent vapor supplied through the solvent vapor supply port may be a steam, the processing gas supplied through the processing gas supply port may be an ozone gas, the drying gas supplied through the drying gas supply port may be a gas containing IPA vapor, and the processing liquid supplied through the processing liquid supply port may be a water.

The substrate processing apparatus may process the substrate by an ozone-assisted process that supplies ozone gas through the processing gas supply port into the first processing chamber containing the substrate after supplying steam through the solvent vapor supply port into the first processing chamber, carry the substrate from the first processing chamber into the second processing chamber by the supporting member, process the substrate by a rinsing process by supplying water through the processing liquid supply port into the second processing chamber, carry the substrate from the second processing chamber into the first processing chamber by the supporting member, and dry the substrate by a drying process that supplies a gas containing IPA vapor through the drying gas supply port into the first processing chamber.

In the substrate processing apparatus, an inert gas pipe-line may be connected to the processing gas supply port so as to supply the inert gas from the processing gas supply port into the first processing chamber.

Preferably, in this case, at least one of the solvent vapor, the processing gas and the drying gas is purged from the first processing chamber by the inert gas supplied through the inert gas pipe-line so that an atmosphere in the first processing chamber is displaced. In the substrate processing apparatus, the second processing chamber may be formed below the first processing chamber.

Thus, the process using the processing gas and the solvent vapor, the process using the liquid and the drying process can be carried out by the substrate processing apparatus requiring a floor space for one processing chamber.

Preferably, in this case, an exhaust pipe-line is connected to the first processing chamber so as to exhaust the atmosphere in the first processing chamber.

Preferably, in this case, a flow control valve is provided in the exhaust pipe-line so as to control a flow rate of the atmosphere exhausted through the exhaust pipe-line to regulate a pressure in the first processing chamber.

Preferably, the substrate processing apparatus is provided with a shutter disposed between the first processing chamber and the second processing chamber and capable of being opened and closed.

The diffusion of the atmosphere created in the first processing chamber into the second processing chamber and the flow of the liquid atmosphere created in the second processing chamber into the first processing chamber can be prevented by closing the shutter while processes are carried out in the first processing chamber and second processing chambers.

Preferably, a plurality of processing gas supply pipe-lines through which different processing gases are supplied, respectively, are connected to the processing gas supply port.

Thus, a plurality of kinds of processes can be achieved by individually using the different gases in combination with a solvent vapor.

Preferably, a plurality of processing liquid supply pipe-lines through which different processing liquids are supplied, respectively, are connected to the processing liquid supply port.

Thus, a plurality of kinds of processes can be achieved by individually using the different processing liquids.

Preferably, in this case, the substrate processing apparatus is provided with a plurality of draining pipe-lines to drain different processing liquids, respectively, from the second processing chamber.

According to another aspect of the present invention, there is provided a substrate processing method for processing a substrate, on which a resist film is formed, by a plurality of processes, comprising the steps of: carrying the substrate into a first processing chamber for containing the substrate; altering the resist film on the substrate into a water-soluble film in the first processing chamber; carrying the substrate, on which the resist film is altered, from the first processing chamber into a second processing chamber for containing the substrate; rinsing the substrate with a water in the second processing chamber so that the water-soluble film is removed from the substrate; carrying the rinsed substrate from the second processing chamber into the first processing chamber; and drying the rinsed substrate in the first processing chamber.

The step of altering the resist film may comprise supplying an ozone gas and a water vapor into the first processing chamber.

Preferably, in this case, the step of altering the resist film is carried out in a pressurized atmosphere in the first processing chamber.

Preferably, the first and second processing chambers are isolated by a shutter while the step of altering the resist film and the step of drying the rinsed substrate are carried out.

BRIEF DESCRIPTION OF THE DRAWINGS

FIG. 1 is a typical view of a substrate processing apparatus in a first embodiment according to the present invention;

DESCRIPTION OF THE PREFERRED EMBODIMENTS

Figure 2:
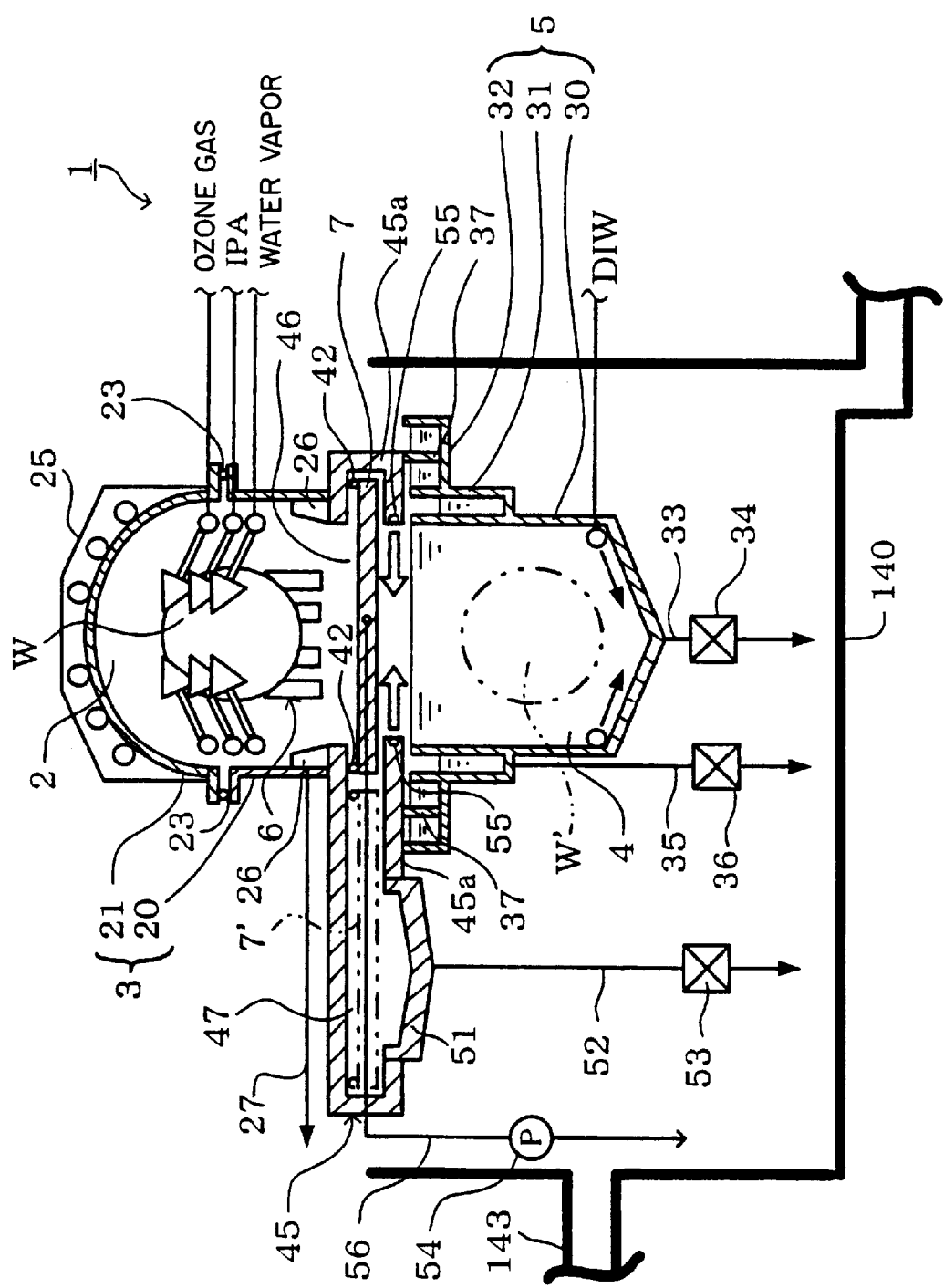
FIG. 2 is an enlarged typical view of a vessel and a cleaning tank included in the substrate processing apparatus shown in FIG. 1.

Preferred embodiments of the present invention will be described with reference to the accompanying drawings.

The present invention will be described as applied to substrate processing apparatus that clean, for example, fifty-two wafers in a batch. The substrate processing apparatus remove a resist from wafers by using ozone gas.

First Embodiment

A substrate processing apparatus 1 in a first embodiment according to the present invention will be described with reference to FIGS. 1 to 9.

Referring to FIG. 1, the substrate processing apparatus 1 includes a vessel 3, a cleaning tank 5, a wafer guide 6, a shutter 7, a steam supply system 8, an ozone gas supply system 9, an IPA supply system 10, a pure water supply system 11 and a draining unit 12. The vessel 3 defines a first processing chamber 2 capable of containing fifty-two wafers W. The cleaning tank 5 disposed below the vessel 3 defining the first processing chamber 2 defines a second processing chamber 4 capable of containing fifty-two wafers W. The wafer guide 6, served as a supporting member, is one of the components of a supporting member for supporting the substrate so as to carry wafers W between the first processing chamber 2 and the second processing chamber 4. The a shutter 7 is disposed so as to allow the first processing chamber 2 and the second processing chamber 4 to communicate with each other and to isolate the first processing chamber 2 and the second processing chamber 4 from each other. The steam supply system 8, the ozone gas supply system 9 and the IPA supply system 10 supply steam, i.e., a solvent vapor, ozone gas ($O_3$ gas), i.e., a processing gas, and IPA vapor, i.e., a drying gas, respectively, into the first processing chamber 2. The pure water supply system 11 supplies pure water, i.e., a processing liquid, into the second processing chamber 4.

As shown in FIG. 2, the vessel 3 can be roughly divided into a body 20 and a cover 21 capable of being joined to the body 20 so as to cover the open upper end of the body 20 and of being removed from the body 20 to open the open upper end of the body 20. The open lower end of the vessel 3 opens into an open space 46 in a passage unit 45. When the open upper end of the body 20 is covered with the cover 21 as shown in FIG. 2, a lip O ring 23 is placed between the body 20 and the cover 21 to prevent the leakage of an atmosphere in the first processing chamber 2 outside the vessel 3.

A lamp heating unit 25 is attached to the outer surface of the cover 21. The lamp heating unit 25 heats wafers W and an atmosphere surrounding the wafers W at a predetermined temperature. Exhaust boxes 26 are placed in the first processing chamber 2. The atmosphere in the first processing chamber 2i is sucked into the exhaust boxes 26 and is discharged outside. An exhaust pipe 27 has one end connected to the exhaust boxes 26 and the other end connected to a plant exhaust system. The cleaning tank 5 has an inner tank 30 defining the second processing chamber 4, a middle tank 31 joined to the inner tank 30 so as to surround the open upper end of the inner tank 30, and an outer tank 32 joined to the middle tank 31 so as to surround the open upper end of the middle tank 31. The open upper end of the inner tank 30 opens into the open space 46. The second processing chamber 4 is filled with a processing liquid.

A drain pipe 33 for draining the processing liquid contained in the second processing chamber 4 is connected to a central portion of the bottom wall of the inner tank 30. The drain pipe 33 is provided with a shutoff valve 34. The processing liquid overflowed the inner tank 30 is received by the middle tank 31 and is drained through an overflow pipe 35 connected to the bottom of the inner tank 30. The overflow pipe 35 is provided with a shutoff valve 36. Pure water is contained always in the outer tank 32. An annular sealing plate 37 is placed in the outer tank 32. The upper end of the sealing plate 37 is in close contact with the bottom surface of the passage unit 45. Thus, the outer tank 32 has a water-sealing function using pure water to prevent the leakage of a liquid atmosphere in the cleaning tank 5 outside the cleaning tank 5.

Figure 3:
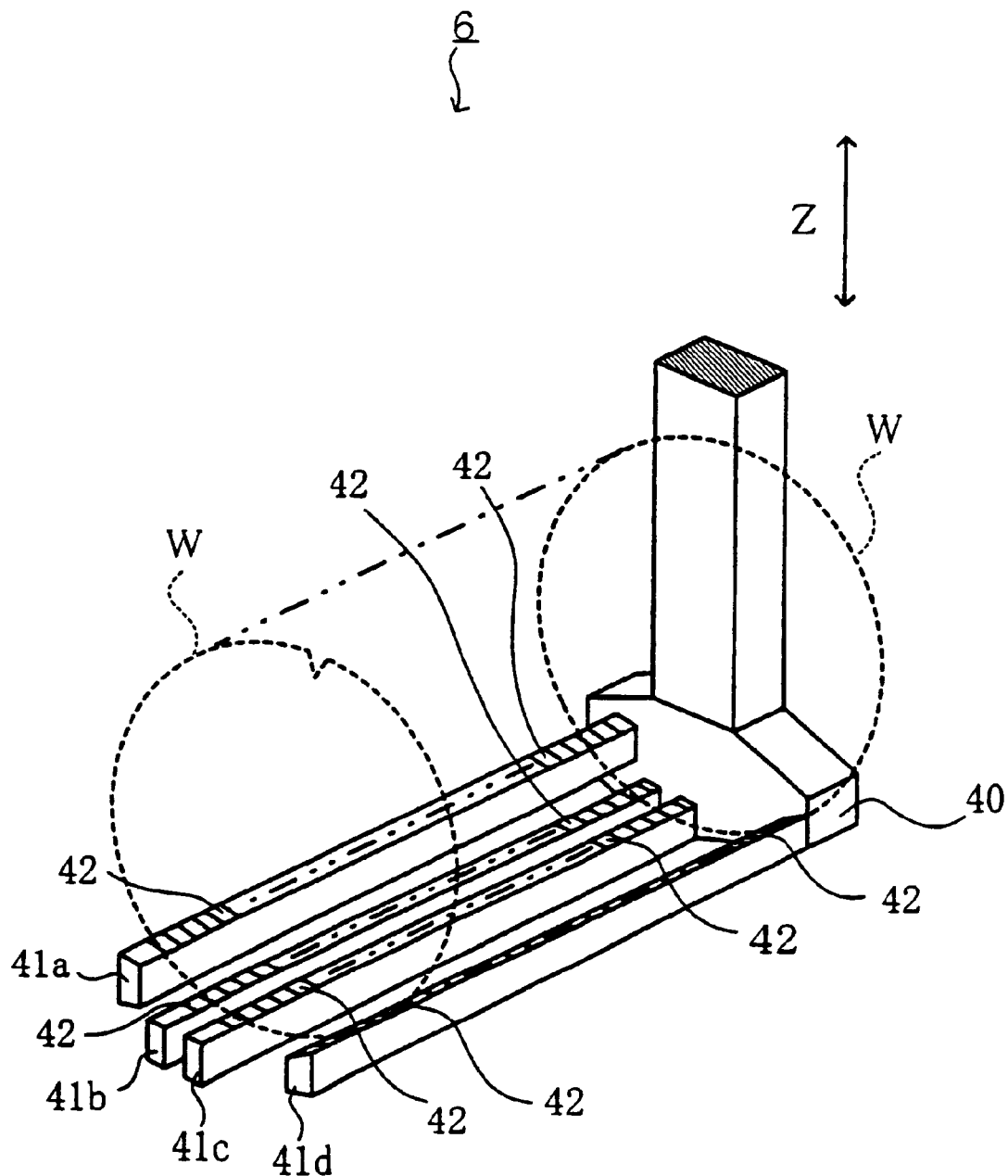
FIG. 3 is a perspective view of a wafer guide.

The wafer guide 6 is moved vertically, i.e., in the directions of the arrows in FIG. 3, by a lifting mechanism, not shown. The wafer guide 6 and the lifting mechanism constitute the supporting member. As shown in FIG. 3, the wafer guide 6 includes a guide member 40, and four parallel holding members 41a, 41b, 41c and 41d fixedly attached to the guide member 40 in a horizontal position. Each of the holding members 41a to 41d is provided with fifty-two grooves 42 arranged at equal intervals. Lower portions of peripheries of wafers W are received in the grooves 42. Fifty-two wafers W can be held at equal intervals on the wafer guide 6. In view of chemical resistance and hardness, it is preferable that each of the guide member 40 and the holding members 41a to 41d is a structure formed of PCTFE (polychlorotrifluoroetylene) and provided with a core of a stainless steel.

Figure 4:
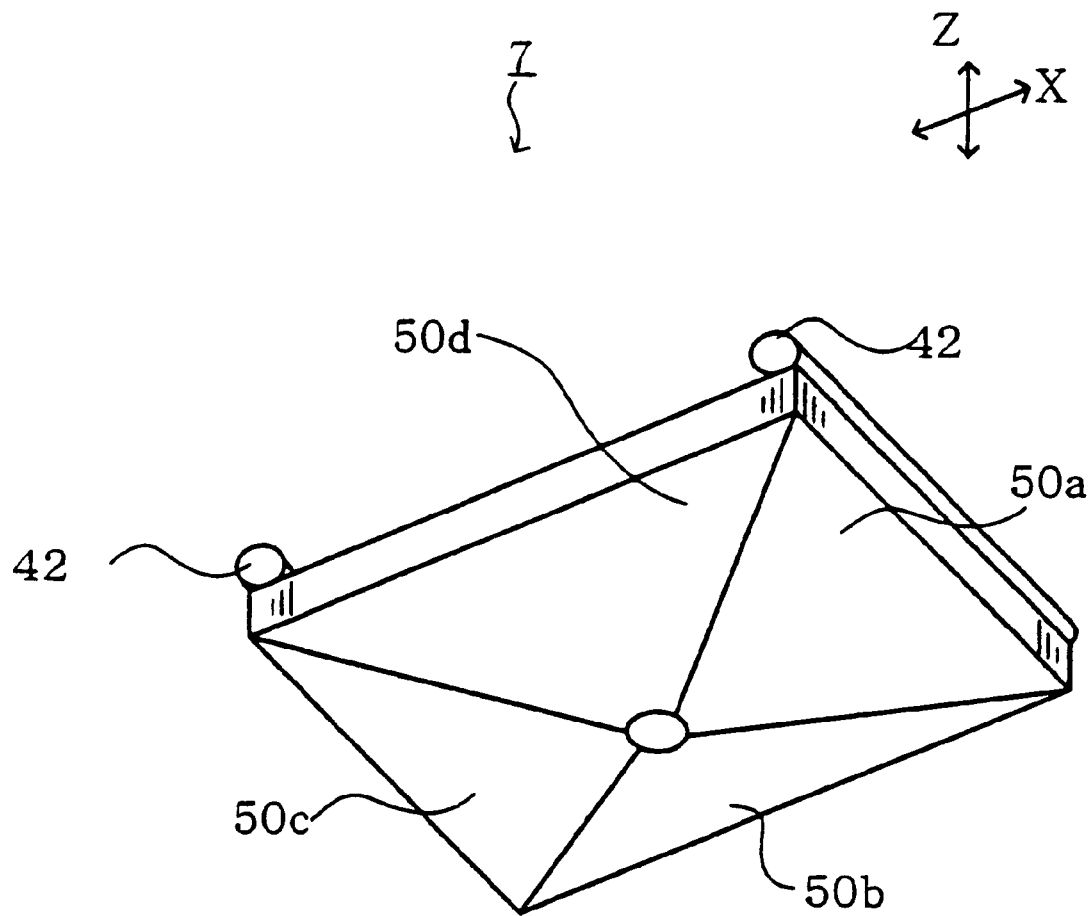
FIG. 4 is a perspective bottom view of a shutter.

As shown in FIGS. 2 and 4, the shutter 7 can be moved by a driving mechanism, not shown, in vertical directions (directions of the arrows Z in FIG. 4) and horizontal directions (directions of the arrows X in FIG. 4). Sealing members 42 are placed on the upper surface of the shutter 7. The shutter 7 is moved for opening and closing operations in the passage unit 45. The passage unit 45 is interposed between the vessel 3 and the cleaning tank 5. The passage unit 45 has the open space 46 and a shutter receiving space 47. In FIG. 2, the shutter 7 indicated by continuous lines is moved to the open space 46 by the driving mechanism, and the sealing members 42 are in close contact with the inner surface of the top wall of the passage unit 45 to isolate the atmosphere in the first processing chamber 2 and the atmosphere in the second processing chamber 4 from each other. In FIG. 2, the shutter 7 indicated by two-dot chain lines 7' is moved to the shutter receiving space 47 by the driving mechanism to permit the first processing chamber 2 and the second processing chamber 4 to communicate with each other.

The shutter 7 has a bottom wall divided into four sections 50a, 50b, 50c and 50d. The sections 50a to 50d are sloped down from the periphery toward a central portion of the bottom wall. The shutter 7 also has a top wall having substantially the same configuration as the bottom wall. A drain pipe-line 56 is connected to the central portion of the shutter 7. A draining member 51 is disposed in the bottom of the shutter receiving space 47 of the passage unit 45. A drain pipe 52 is connected to the draining member 51. The drain pipe 52 is provided with a shutoff valve 53. When the shutter 7 is closed, liquid drops formed on the bottom wall of the shutter 7 by the condensation of the liquid atmosphere in the cleaning tank 5 flow along the sections 50a to 50d of the bottom wall and gather in a central portion of the bottom wall and the gathered liquid drops are drained through a drain pipe-line 56 extended in the passage unit 45. Liquid drops formed on the top wall of the shutter 7 by the condensation of the atmosphere in the first processing chamber gather in the central portion of the shutter 7 and the gathered liquid drops are drained by a pump 54. When the shutter 7 wetted with liquid drops is opened, the liquid drops fallen off the shutter 7 are drained through draining member 51 and the drain pipe 52.

$N_2$ supply ports 55 are formed in opposite end portions (right and left end portions as viewed in FIG. 2) of the bottom wall 45*a* of the passage unit 45, respectively. N₂ gas is jetted through the N₂ supply ports 55 to form an air curtain over the second processing chamber 4. The atmospheres in the first processing chamber 2 and the second processing chamber 4 can be separated from each other by the air curtain.

Figure 5:
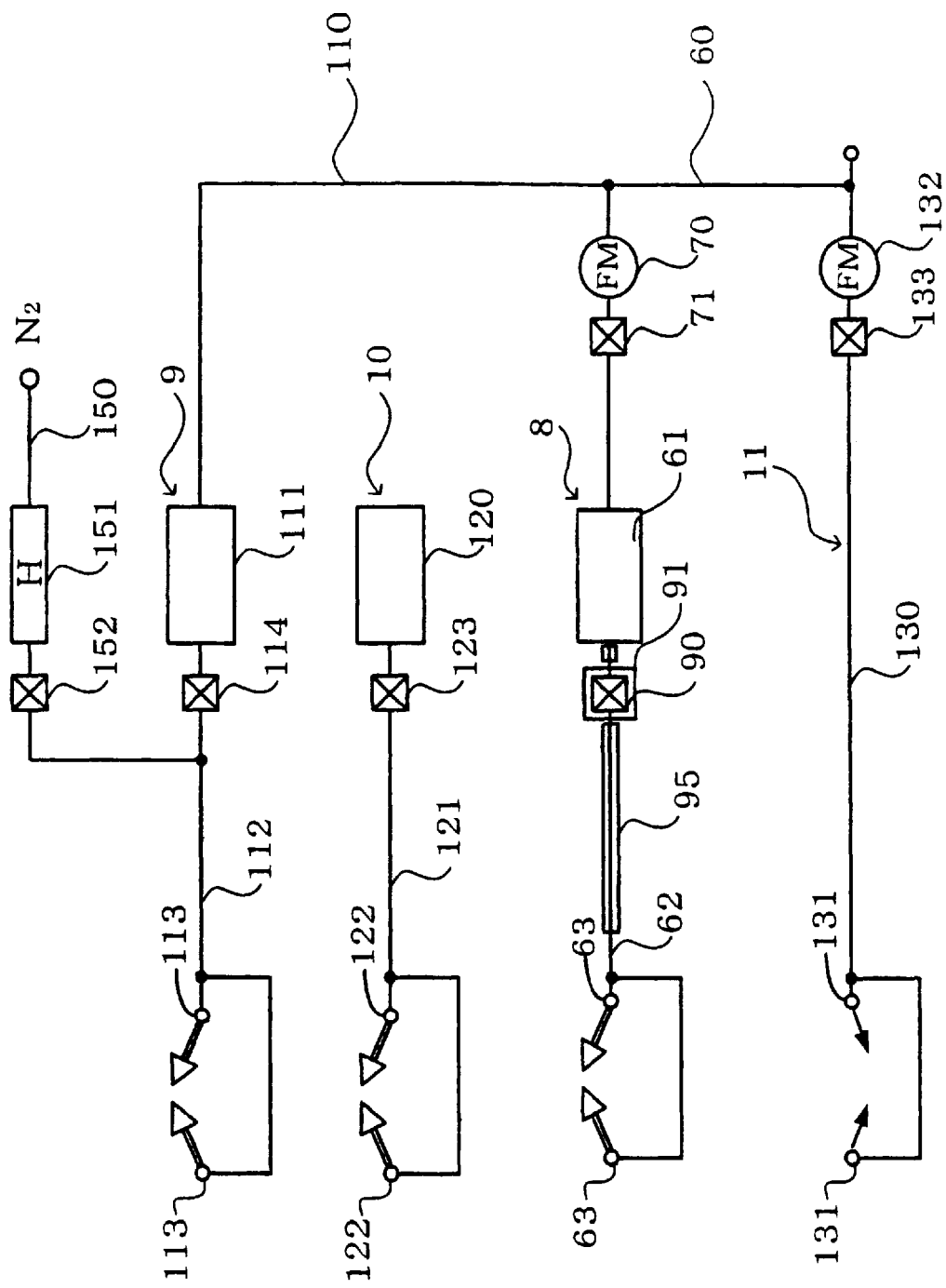
FIG. 5 is a piping diagram of a steam supply system, an ozone gas supply system, an IPA supply system and a pure water supply system.
Figure 6:
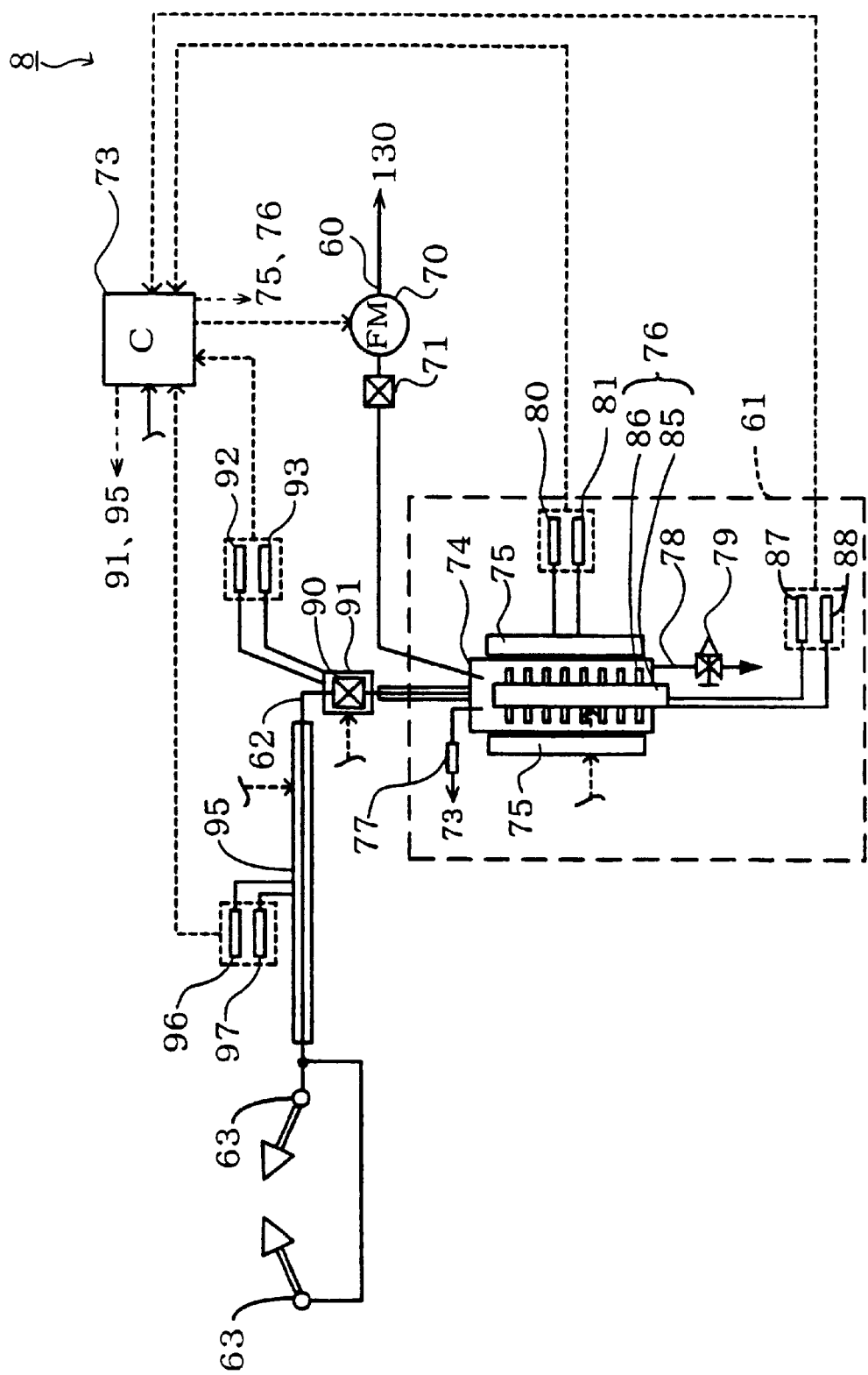
FIG. 6 is an enlarged piping diagram of an essential portion of the steam supply system.

Referring to FIGS. 5 and 6, the steam supply system 8 has a pure water supply pipe-line 60 for supplying pure water, a steam generating unit 61 that gasifies pure water supplied through the pure water supply pipe-line 60 to generate steam, and a steam supply pipe-line 62 through which steam generated by the steam generating unit 61 is supplied. Water vapor supplied through the steam supply pipe-line 62 is discharged through steam supply members 63, each forming solvent vapor supply ports, into the first processing chamber 2. The inlet end of the pure water supply pipe-line 60 is connected to a pure water supply pipe-line 130 included in the pure water supply system 11, which will be described later.

As shown in FIG. 6, the pure water supply pipe-line 60 is provided with a flow controller 70 and a shutoff valve 71. The flow controller 70 is connected to a controller 73. The steam generating unit 61 has a cylinder 74. The pure water supply pipe-line 60 is connected to an upper portion of the cylinder 74. A rubber heater 75 is applied to the side surface of the cylinder 74. A cartridge heater 76 is inserted in the cylinder 74. The sensing head of a temperature sensor 77 is inserted in the cylinder 74. The temperature sensor 77 gives a signal indicating the temperature of the interior of the cylinder 74 measured by the temperature sensor 77 to the controller 73 and the controller 73 monitors the temperature of the interior of the cylinder 74. The temperature sensor 77 is, for example, a K-type thermocouple. A pure water draining pipe-line 78 is connected to the bottom wall of the cylinder 74 to drain pure water that could not have been gasified from the cylinder 74. The pure water draining pipe-line 78 is provided with a flow control valve 79.

The rubber heater 75 is connected to the controller 73. The controller 73 supplies power to the rubber heater 75 to heat the interior of the cylinder 74. A temperature control sensor 80 and an overheat sensor 81 are connected to the rubber heater 75 and the controller 73. The controller 73 receives a signal indicating the present temperature of the rubber heater 75 from the temperature control sensor 80 to control the heating operation of the rubber heater 75. The controller 73 receives a signal indicating the temperature of the rubber heater 75 from the overheat sensor 81 and monitors the temperature of the rubber heater 75 to prevent the overheat of the rubber heater 75. The rubber heater 75 has a large specific heating capacity, i.e., a large thermal output per unit area. The temperature control sensor 80 and an overheat sensor 81 are, for example, K-type thermocouples. The rubber heater 75 is lagged with an heat insulating material, not shown, to prevent the thermal influence of the rubber heater 75 on surroundings. The heat insulating material is a material capable of withstanding heat of 200° C. or above, such as silicone rubber.

The cartridge heater 76 has a heating pipe 85 and a plurality of disks 86 attached to the outer circumference of the heating pipe 85. The cartridge heater 76 generates heat when power is supplied thereto by the controller 73. A temperature control sensor 87 and an overheat sensor 88 are connected to the cartridge heater 76. The temperature control sensor 87 and the overheat sensor 88 are connected to the controller 73. The heating operation of the cartridge heater 76, similarly to that of the rubber heater 75, is controlled properly by the controller 73. Pure water supplied through the pure water supply pipe-line 60 is dropped at a low rate on the heated heating pipe 85 and the disks 86 to generate steam. Flow of pure water, steam generating rate, and the density and temperature of steam can be properly controlled by controlling the opening of the flow controller 71. The steam generating unit 61 may be provided with a level gage pipe that enables the visual observation of the level of pure water in the cylinder 74 to monitor the level of pure water that has not been gasified and remaining in the cylinder 74.

The steam supply pipe-line 62 is connected to an upper portion of the cylinder 74 and is provided with a shutoff valve 90. A plate heater 90 is combined with the shutoff valve 90. The controller 73 supplies power to the plate heater 91 to make the plate heater 91 generate heat. The maximum heating temperature (effective temperature) of the plate heater 91 is, for example, 150° C. A temperature control sensor 92 and an overheat sensor 93 are attached to the plate heater 91. The respective outputs of the temperature control sensor 92 and the overheat sensor 93 are connected to the controller 73. The controller 73 controls the heating operation of the plate heater 91 properly.

A ribbon heater 95 is combined with the steam supply pipe-line 62. The controller 73 supplies power to the ribbon heater 95 to make the ribbon heater 95 generate heat. The effective temperature of the ribbon heater 95 is in the range of 90 to 120° C. A temperature control sensor 96 and an overheat sensor 97 are attached to the ribbon heater 95. The respective outputs of the temperature control sensor 96 and the overheat sensor 97 are connected to the controller 73. The controller 73 controls the heating operation of the ribbon heater 97 properly. The plate heater 91 and the ribbon heater 95 heat steam flowing through the steam supply pipe-line 62 to prevent the steam from liquefying. A steam discharge pipe-line may be connected to the steam supply pipe-line 62 to discharge steam through the steam discharge pipe-line in an initial stage of steam generation until the temperature of the cylinder 74 and steam generation in the cylinder 74 are stabilized. A N₂ supply pipe or an air supply pipe may be connected to the cylinder 74 to send out steam from the cylinder 74 by N₂ gas or air.

Figure 7:
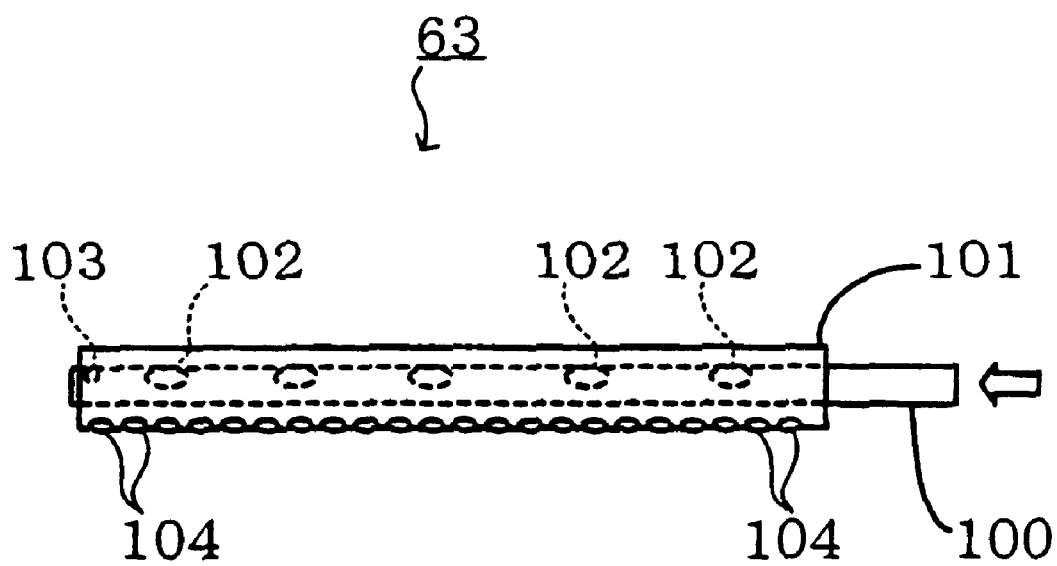
FIG. 7 is a side elevation of a steam supply member.

As shown in FIG. 7 the steam supply member 63 has an inner pipe 100 and an outer pipe 101 surrounding the inner pipe 100. The inner pipe 100 is provided with, for example, five ports 102 arranged at equal intervals and a 0.8 mm diameter hole 103 formed in an end portion thereof. The outer pipe 101 is provided with fifty-two-six ports 104 arranged at equal intervals corresponding to, for example, the pitches of 3.175 mm of wafers W held in the first processing chamber 2 on one side thereof opposite the other side thereof on the side of the ports 102. Each steam supply member 63 distributes steam supplied into the inner pipe 100 uniformly in the outer pipe 101 to discharge the steam uniformly through the ports 104.

As shown in FIG. 5, the ozone gas supply system 9 has a branch pipe-line 110 branched from the pure water supply pipe-line 60, an ozone gas generator 111 that generates ozone gas, and an ozone gas supply pipe-line 112 through which ozone gas generated by the ozone gas generator 111 is supplied. Ozone gas supplied through the ozone gas supply pipe-line 112 is discharged through ozone gas supply members, each forming processing gas supply ports.

The ozone gas generator 111 is connected to the branch pipe-line 110. The ozone gas generator 111 generates ozone gas through the electrolysis of pure water supplied thereto through the branch pipe-line 110. Desirably, ozone gas having an ozone concentration of, for example, about 141 g/m³ (normal) (about 6.6% by volume) is generated and is supplied through the ozone gas supply pipe-line 112 at a flow rate of about 50 l/min. The ozone gas generator 111 may use oxygen gas ($O_2$ gas) instead of pure water and may generate ozone gas by passing oxygen gas through a space between discharge electrodes. The ozone gas supply pipe-line 112 is provided with a shutoff valve 114. The ozone gas supply members 113 are similar in construction to the steam supply members 63, and hence the description thereof will be omitted.

The IPA supply system 10 has an IPA vapor generating unit 120 that generates IPA vapor, and an IPA supply pipe-line 121 through which IPA vapor generated by the IPA vapor generating unit 120 is supplied. IPA vapor supplied through the IPA vapor supply pipe-line 121 is discharged through IPA vapor supply members 122, each forming drying gas supply ports, into the first processing chamber 2. The IPA supply pipe-line 121 is provided with a shutoff valve 123. The IPA vapor supply members 122 are similar in construction to the steam supply members 63 and the ozone gas supply members 113 and hence the description thereof will be omitted. A $N_2$ gas supply pipe may be connected to the IPA vapor supply pipe-line 121, IPA vapor and $N_2$ gas may be mixed in the IPA vapor supply pipe-line 121 to produce a mixed gas, and the mixed gas may be supplied to the IPA vapor supply members 122.

The pure water supply system 11 has the pure water supply pipe-line 130 through which pure water (DIW) is supplied. Pure water supplied through the pure water supply pipe-line 130 is discharged through pure water supply members 131, each forming processing liquid supply ports, into the second processing chamber 4. An inlet end of the pure water supply pipe-line 130 is connected to a pure water source, not shown. The pure water supply pipe-line 130 is provided with a flow controller 132 and a shutoff valve 133.

Referring to FIGS. 1 and 2, the draining unit 12 has a box 140 containing the vessel 3 and the cleaning tank 5, and a drain pipe-line 141 (FIG. 1) through which the processing liquid is drained. As shown in FIG. 2, the drain pipe, 33, the overflow pipe 35, the drain pipe 52 and the drain pipe-line 56 are extended in the box 140 and the respective outlets thereof are opened into the box 140. The drain pipe-line 141 has one end connected to a bottom portion of the box 140 and the other end connected to a drain system of the plant. The drain pipe-line 141 is provided with a shutoff valve 142. The shutoff valve 142 is opened to drain the processing liquids drained through the drain pipes 33 and 52 and the overflow pipe 35 into the box 140 through the drain pipe-line 141 to the drain system of the plant. An exhaust pipe-line 143 for exhausting the box 140 is connected to the box 140. An atmosphere around the vessel 3 and the cleaning tank 4 can be exhausted from the box 140. Thus, the diffusion of the atmosphere in the first processing chamber 2 and the liquid atmosphere in the cleaning tank 5 into the external space can be prevented, for example, when the cover 21 is removed to carry wafers W into and out of the vessel 3.

Referring to FIGS. 1 and 5, a $N_2$ gas supply pipe-line 150 for supplying $N_2$ gas or hot $N_2$ gas is connected to the ozone gas supply pipe-line 112 of the ozone gas supply system 9. The inlet end of the $N_2$ gas supply pipe-line 150 is connected to a $N_2$ gas source, not shown. The $N_2$ gas supply pipe-line 150 is provided with a heater 151 for heating $N_2$ gas and a shutoff valve 152. Thus, $N_2$ gas or hot $N_2$ gas can be supplied to the ozone gas supply members 113. When the shutoff valves 114 and 152 are opened and the heater 151 is energized, $N_2$ gas of an ordinary temperature supplied from the $N_2$ gas source can be heated at a predetermined temperature and hot $N_2$ gas can be discharged through the ozone gas supply members 113. Wafers W can be quickly heated at a predetermined temperature or dried by blowing hot $N_2$ gas directly against the wafers W. When the heater 151 is not energized, $N_2$ gas of an ordinary temperature can be discharged for purging. For example, $N_2$ purging is carried out in a period between the time after processed wafers W have been carried out of the vessel 3 and the time before carrying wafers W to be processed into the vessel 3 to purge the first processing chamber 2 of ozone gas and steam, i.e., to replace the atmosphere in the first processing chamber 3 with $N_2$ gas.

Hot air may be used instead of hot $N_2$ gas for heating wafers W. When hot air is used to heat wafers W, a hot air supply pipe-line for supplying hot air and a purging $N_2$ gas supply pipe-line are extended individually. The hot air supply pipe-line or the N2 gas supply pipe-line is connected selectively to the ozone gas supply members 113; that is, the hot air supply pipe-line is connected to the ozone gas supply members 113 when heating wafers W, or the N2 gas supply pipe-line is connected to the ozone gas supply members 113 when carrying out $N_2$ purging.

The substrate processing apparatus 1 moves the wafer guide 6 vertically to place wafers W in the first processing chamber 2 or the second processing chamber 4. In FIGS. 1 and 2, wafers W held on the wafer guide 6 raised to an upper position in the first processing chamber 2 are indicated by continuous lines, and wafers held on the wafer guide 6 lowered to a lower position in the second processing chamber 4 are indicated by two-dot chain line W'.

In a state where wafers W are placed in the first processing chamber 2, an ozone-assisted process can be achieved by supplying ozone gas by the ozone gas supply system 9 and steam by the steam supply system 8 into the first processing chamber 2, and a drying process can be achieved by supplying IPA vapor by the IPA supply system 10 into the first processing chamber 2. In a state where wafers W are placed in the second processing chamber 4, a rinsing process can be achieved by supplying pure water into the second processing chamber 4 by the pure water supply system 11. Thus, the substrate processing apparatus carries out continuously the ozone-assisted process (a wafer processing process using steam as a processing gas) and a subsequent rinsing process and a drying process in a sealed space.

A cleaning method to be carried out by the substrate processing apparatus 1 will be described with reference to a flow chart shown in FIG. 8. The cover 21 is opened and, for example, fifty-two wafers W provided with a resist film is carried into the vessel 3 in step S1. The cover 21 is closed in step S2. The shutter 7 is closed and an air curtain is formed by discharging $N_2$ gas through the $N_2$ ports 55 to isolate the atmosphere in the first processing chamber 2 from that in the second processing chamber 4.

Subsequently, an ozone-assisted process is carried out in the first processing chamber 2 in step S3. The lamp heating unit 25 is energized to generate heat, hot $N_2$ gas is discharged through the ozone gas supply members 113 to heat the wafers W at a predetermined temperature. Preferably, the predetermined temperature is lower than the dew point of steam supplied into the first processing chamber 2 and in a temperature range that is optimum for the process.

After heating the wafers W for a predetermined heating time, the discharge of hot $N_2$ gas is stopped and the steam supply system 8 supplies steam into the first processing chamber 2. Since the wafers W are heated at the temperature lower than the dew point of the steam, the steam that comes into contact with the wafers W condenses properly and thin pure water films can be formed on the wafers W. Subsequently, the ozone gas supply system 9 supplies ozone gas into the first processing chamber 2. Consequently, the ozone gas dissolves in the thin pure water films to form ozone-containing liquid films on the wafers W. The ozone-containing liquid films contain a large amount of radicals of oxygen atoms, hydrogen atoms and hydroxyl groups. The radicals do not become extinct and cause an oxidizing reaction immediately to decompose the resist forming the resist films into carboxylic acid, carbon dioxide and water.

Thus, the resist films can be sufficiently oxidized and decomposed and are altered into water-soluble films by the ozone-containing liquid films. Since the wafers W are heated by heat generated by the lamp heating unit 25 at temperatures in a temperature range that ensures active oxidizing reaction, the ozone-assisted process can be promoted. The water-soluble resist films can be easily removed by the subsequent rinsing process.

The supply of steam and ozone gas is stopped to terminate the ozone-assisted process. Subsequently, the rinsing process is carried out in the second processing chamber 4 in step S4. Pure water is supplied into the second processing chamber 4 through the pure water supply members 131 of the pure water supply system 11. After the second processing chamber 4 has been filled up with pure water, the shutter 7 is opened, the wafer guide 6 is lowered to carry the wafers W quickly into the second processing chamber 4 in the substrate processing apparatus 1. Thus, the wafers W can be immerse in the pure water in a short time without being exposed to the external atmosphere for rinsing process. As mentioned above, since the resist film is altered into the water-soluble films, the resist films can be easily removed from the wafers W in the second processing chamber 4.

During the rinsing process, new pure water is supplied continuously by the pure water supply system 11, and the pure water overflowed the inner tank 30 defining the second processing chamber 4 is received by the middle tank 31. Thus, pure water is supplied during the rinsing process so as to overflow the inner tank 30 for overflow rinsing. The valve 36 is opened to drain the overflowed pure water through the overflow pipe 35 and the box 140 into a draining unit 12. During the rinsing process, rising currents of the pure water are produced in the second processing chamber 4. Thus, the pure water can be uniformly applied to the wafers W for uniform rinsing.

Then, the wafers W are subjected to a drying process in the first processing chamber 2 in step S5. The wafer guide 6 is raided to carry the wafers W quickly into the first processing chamber 2, and then the shutter 7 is closed. IPA vapor or a mixture of IPA vapor and $N_2$ gas is supplied into the first processing chamber 2 by the IPA supply system 10. An IPA component, such as carbon, remaining on the wafers W can be vaporized and removed from the wafers W by blowing hot $N_2$ gas through the ozone gas supply members 113 against the wafers W after supplying IPA vapor or a mixture of IPA vapor and $N_2$ gas into the first processing chamber 2. Hot $N_2$ gas may be blown against the wafers W for the drying process through the ozone gas supply members 113 of the ozone gas supply system 9 instead of blowing IPA vapor or a mixture of IPA vapor and $N_2$ gas against the wafers W.

It is desirable to create an atmosphere of an ordinary temperature in the first processing chamber 2 after the completion of the drying process to provide a safe working environment by supplying $N_2$ gas of an ordinary temperature through the ozone gas supply members 113 of the ozone gas supply system 9 into the first processing chamber 2. It is preferable to supply IPA vapor or a mixture of IPA vapor and $N_2$ gas into the first processing chamber 2 so as to fill up the first processing chamber 2 before carrying the wafers W from the second processing chamber 4 into the first processing chamber 2 because the IPA vapor or the mixture of IPA vapor and $N_2$ gas filling up the first processing chamber 2 promotes the drying process.

After the drying process has been completed, the cover 21 is opened in step S6, and the wafers W are taken out of the vessel 3 and are carried away from the substrate processing apparatus 1 in step S7. When the cover 21 is opened, the atmosphere surrounding the vessel 3 and the cleaning tank 5 is exhausted from the box 140 to prevent the diffusion of the atmospheres in the first processing chamber 2 and the second processing chamber 4. The first processing chamber 2 is purged of the atmosphere by supplying $N_2$ gas of an ordinary temperature through the ozone gas supply members 113 of the ozone gas supply system 9 into the first processing chamber 2 before receiving fifty-two wafers W to be processed by the next processing cycle into the first processing chamber 2.

Since the second processing chamber 4 is formed below the first processing chamber 2, the substrate processing apparatus 1 is able to carry out the ozone-assisted process, the rinsing process and the drying process continuously by using a floor space for one processing chamber. Thus, the substrate processing apparatus can be formed in a small size. Since the wafers W are not taken out of the substrate processing apparatus 1 throughout a period between the start of the ozone-assisted process and the completion of the drying process, the exposure of the wafers W to air outside the substrate processing apparatus after the ozone-assisted process can be prevented.

Since the second processing chamber 4 is formed below the first processing chamber 2, the wafers can be quickly moved in vertical directions to start the rinsing process immediately after the ozone-assisted process and to start the drying process immediately after the rinsing process. Thus, it is possible for the substrate processing apparatus to prevent the formation of a natural oxide film on the wafer W and the alteration of the water-soluble resist film formed by the alteration of the resist film by the ozone-assisted process into an insoluble film by the agency of air outside the substrate processing apparatus. It is possible for the substrate processing apparatus to prevent the alteration of various reactive reaction products produced on the wafer W by the ozone-assisted process into other substances, such as contaminants, by the agency of air outside the substrate processing apparatus. Consequently, the rinsing process can be properly carried out and the throughput of the substrate processing apparatus can be enhanced. When carrying out various processes in the first processing chamber 2 and the second processing chamber 4, the shutter 7 can be closed and an air curtain can be formed. Therefore, it is possible to prevent the diffusion of the atmosphere in the first processing chamber 2 into the second processing chamber 4 and the diffusion of the liquid atmosphere in the second processing chamber 4 into the first processing chamber 2.

Figure 9:
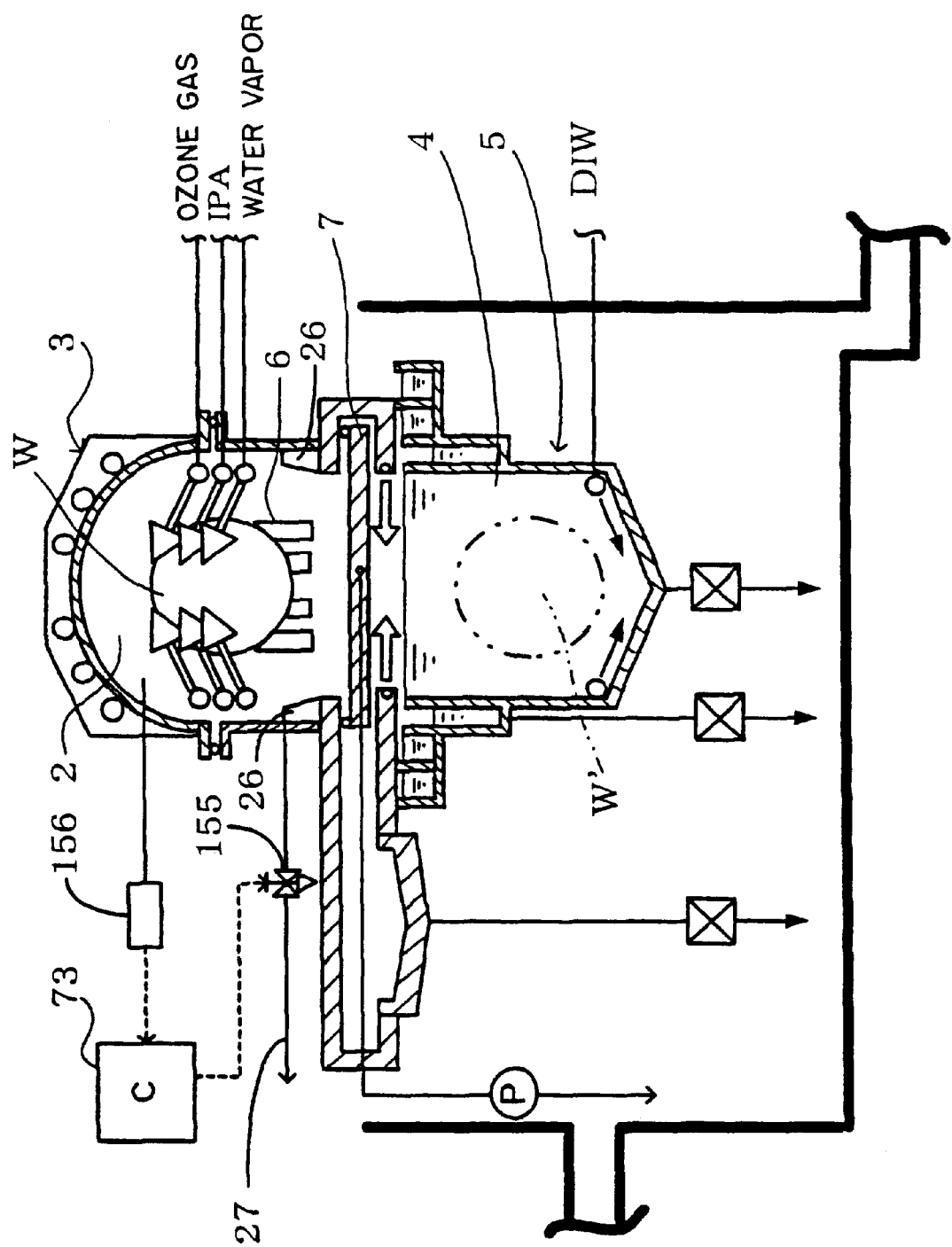
FIG. 9 is an enlarged typical view, similar to FIG. 2, of the substrate processing apparatus when an exhaust pipe is provided with a flow control valve.

Although the substrate processing apparatus in the first embodiment discharges the atmosphere in the first processing chamber 2 freely through the exhaust pipe 27 during the ozone-assisted process, the exhaust pipe 27 may be provided with a flow control mechanism as shown in FIG. 9 to control pressure in the first processing chamber 2 optionally. As shown in FIG. 9, the exhaust pipe 27 is provided with a flow control valve 155. The flow control valve 155 is connected to the controller 73. Pressure in the first processing chamber 2 is measured by a pressure sensor 156. The pressure sensor 156 is connected to the controller 73. The controller 73 controls the opening of the flow control valve 155 on the basis of a signal given thereto by the pressure sensor 156.

During the process, the opening of the flow control valve 155 of the exhaust pipe 27 is reduced to discharge the atmosphere at a low rate so that a pressurized atmosphere of, for example, 196 kPa is created in the first processing chamber 2. Thus, the ozone concentration of the atmosphere in the first processing chamber 2 can be increased. When forming a liquid film containing ozone on the wafer W for processing by dissolving ozone gas in a pure water film, an increased quantity of ozone gas can be dissolved in the pure water film. Thus, a liquid film containing ozone in a very high ozone concentration can be formed, which further enhances the processing ability.

In the foregoing cleaning method supplies ozone gas after supplying steam, steam and ozone gas may be simultaneously supplied into the first processing chamber 2. When steam and ozone gas are supplied simultaneously into the first processing chamber 2, the steam and the ozone gas collide and mix to produce a mixed gas in the first processing chamber 2. The mixed gas contains a large amount of free radicals of oxygen and hydrogen. The radicals reaching the wafer W cause an oxidizing reaction and, similarly to the ozone-containing liquid film, decompose the resist forming the resist films into carboxylic acid, carbon dioxide and water. Thus, the resist film can be satisfactorily oxidized and decomposed into water-soluble substances by the mixed gas of steam and ozone gas.

The steam supply system 8 and the ozone gas supply system 9 are arranged individually to generate steam and ozone gas individually and steam and ozone gas are supplied simultaneously. Therefore, the mixed gas can be produced and radicals can be produced in the first processing chamber 2. Consequently, the life of the mixed gas of steam and ozone gas can be extended and the mixed gas is able to reach the wafer W easily. The resist film formed on the wafer W is altered into a water-soluble film not only by the direct interaction of the mixed gas and the resist film but by various modes and reactions in the first processing chamber 2. For example, an ozone-containing liquid film is formed immediately by condensing the mixed gas properly on the wafer W. This ozone-containing film contains a large amount of reactive species including radicals of oxygen and hydrogen and is capable of satisfactorily oxidizing and decomposing the resist film to alter the same into a water-soluble film.

Instead of carrying out the rinsing process by a dip cleaning system that dips wafers W in pure water supplied through the pure water supply members 131, the rinsing process may be carried out by a shower cleaning system that jets pure water upward and downward against wafers W through shower heads disposed in upper and lower regions of the second processing chamber 4. The pure water supply system 11 may be provided with both the pure water supply members 131 and shower heads. When the pure water supply system 11 is provided with both the pure water supply members 131 and shower heads, the rinsing process can be carried out by both the dip cleaning system and the shower cleaning system in the second processing chamber 4.

Second Embodiment

A substrate processing apparatus 160 in the second embodiment according to the present invention will be described with reference to FIG. 10.

The substrate processing apparatus 160, differing from the substrate processing apparatus 1 that carries out one kind of wafer processing process using one kind of processing gas and steam and one kind of liquid processing process using one kind of processing liquid, is a multiple-purpose substrate processing apparatus that carries out a plurality of kinds of wafer processing processes using a plurality of kinds of processing gases and steam and carries out a plurality of kinds of liquid processing processes.

Figure 10:
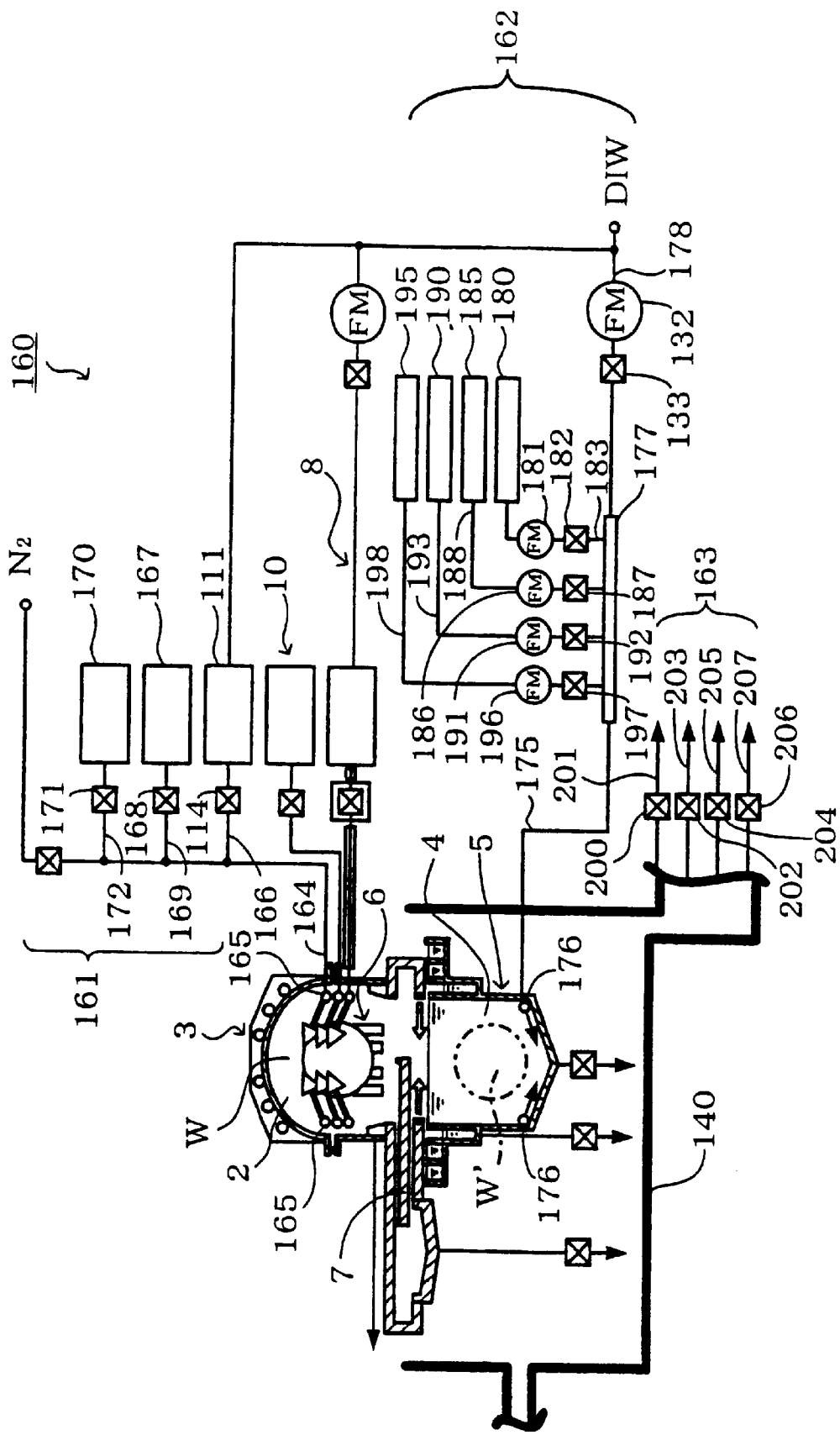
FIG. 10 is a typical view of a substrate processing apparatus in a second embodiment according to the present invention.

Referring to FIG. 10, the substrate processing apparatus 160 has a processing gas supply system 161 capable of supplying ozone gas, hydrofluoric acid vapor (HF vapor) and chlorine gas ($Cl_2$ gas) and a processing liquid supply system 162 capable of supplying pure water, an ammonia solution ($NH_4OH$), a hydrogen peroxide solution ($H_2O_2$), hydrochloric acid and hydrofluoric acid. The substrate processing apparatus 160 is provided with a draining system 163 for draining APM, HPM and DHF in addition to pure water. The substrate processing apparatus 160 is the same in construction as the previously described substrate processing apparatus 1, except that the former is provided with the processing gas supply system 161, the processing liquid supply system 162 and the draining system 163. Therefore, parts shown in FIG. 10 like or corresponding to those of the substrate processing apparatus 1 shown in FIG. 1 are denoted by the same reference characters and the description thereof will be omitted.

The processing gas supply system 161 has gas supply members, each forming gas ports, and a gas supply pipe-line 164 connected to the gas supply members 161. An ozone gas supply pipe-line 166, a hydrofluoric acid vapor supply pipe-line 169 and a chlorine gas supply pipe-line 172 are connected to the gas supply pipe-line 164. The ozone gas supply pipe-line 166 is connected through the shutoff valve 114 to the ozone gas generator 111. The hydrofluoric acid vapor supply pipe-line 169 is connected through a shutoff valve 168 to a hydrofluoric acid vapor generating unit 167. The chlorine gas supply pipe-line 172 is connected through a shutoff valve 171 to a chlorine gas supply unit 170. A N2 gas supply pipe-line is connected to the gas supply pipe-line 164 to carry out $N_2$ purging by supplying $N_2$ gas through the gas supply members 165.

The processing liquid supply system 162 has a processing liquid supply pipe-line 175 connected to liquid supply members 176, each forming liquid ports. A junction pipe 177 is connected to the inlet end of the processing liquid supply pipe-line 175 to mix different processing liquids therein. A pure water supply pipe-line 178, an ammonia solution supply pipe-line 183, a hydrogen peroxide solution supply pipe-line 188, a hydrochloric acid supply pipe-line 193 and a hydrofluoric acid supply pipe-line 198 are connected to the junction pipe 177. The pure water supply pipe-line 178 is provided with the flow controller 132 and the shutoff valve 133. The ammonia solution supply pipe-line 183 is connected through a flow controller 181 and a shutoff valve 182 to an ammonia solution supply unit 180. The hydrogen peroxide solution supply pipe-line 188 is connected through a flow controller 186 and a shutoff valve 187 to a hydrogen peroxide solution supply unit 185. The hydrochloric acid supply pipe-line 193 is connected through a flow controller 191 and a shutoff valve 192 to a hydrochloric acid supply unit 190. The hydrofluoric acid supply pipe-line 198 is connected through a flow controller 196 and a shutoff valve 197 to a hydrofluoric acid supply unit 195.

The APM (processing liquid) can be produced by properly controlling the respective openings of the flow controllers 132, 181 and 186 to mix an ammonia solution, a hydrogen peroxide solution and pure water in a predetermined mixing ratio in the junction pipe 177. The HPM (processing liquid) can be produced by properly controlling the respective openings of the flow controllers 132, 186 and 191 to mix hydrochloric acid, a hydrogen peroxide solution and pure water in a predetermined mixing ratio in the junction pipe 177. The DHF (processing liquid) can be produced by properly controlling the respective openings of the flow controllers 186 and 196 to mix hydrofluoric acid and a hydrogen peroxide solution in a predetermined mixing ratio in the junction pipe 177. Chemical liquid cleaning processes, i.e., an SC1 cleaning process using the APM (SC1 treatment), an SC2 cleaning process using the HPM (SC2 treatment) and an HF cleaning process using the DHF (HF treatment), can be carried out in the second processing chamber 4. Only pure water is supplied into the second processing chamber 4 to carry out a rinsing process (QDR rinsing) or the OF rinsing process between different chemical liquid cleaning processes.

The draining system 163 has an APM drain pipe-line 201, an HPM drain pipe-line 203, a DHF drain pipe-line 205 and a pure water drain pipe-line 207, which are connected to bottom portions of the box 140. The APM drain pipe-line 201, the HPM drain pipe-line 203, the DHF drain pipe-line 205 and the pure water drain pipe-line 207 are provided with shutoff valves 200, 202, 204 and 206, respectively.

Figure 8:
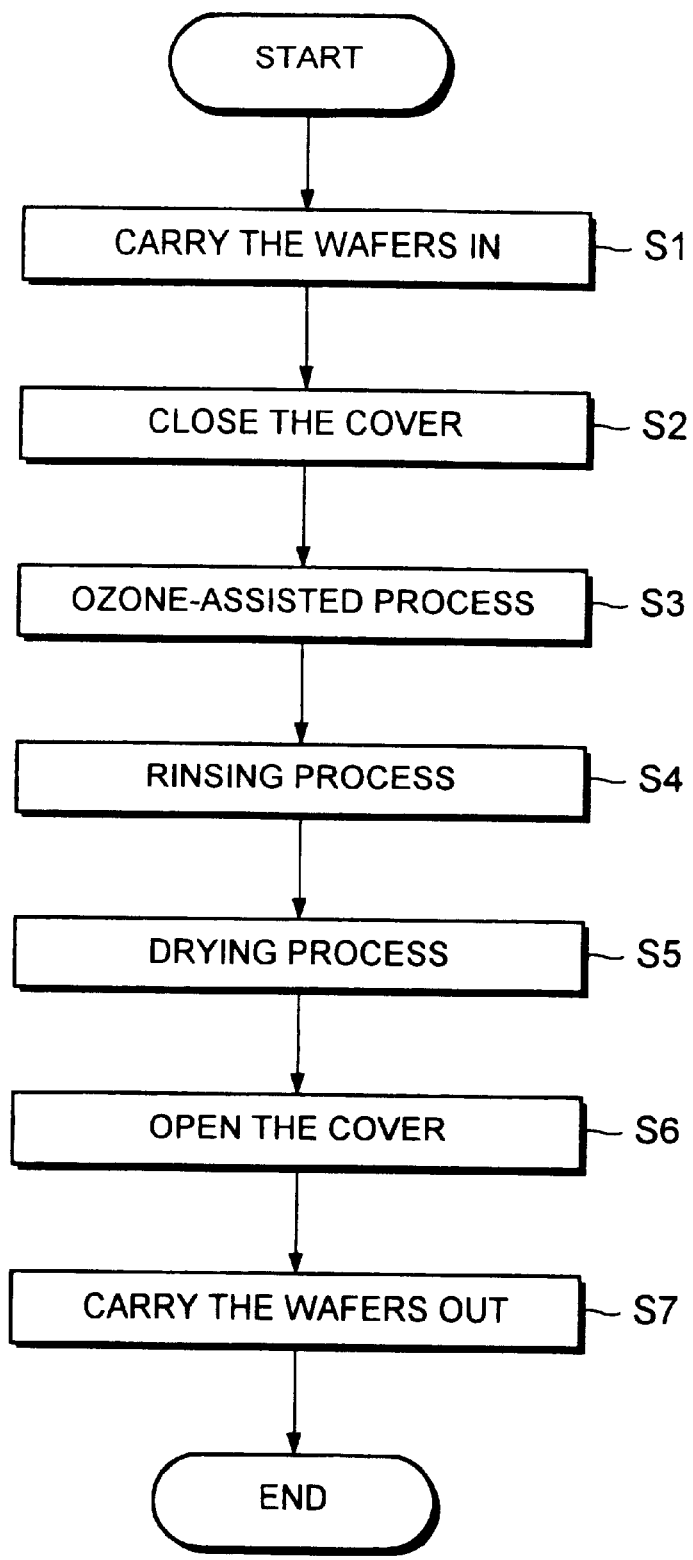
FIG. 8 is a flow chart of a substrate processing procedure to be carried out by the substrate processing apparatus shown in FIG. 1.
Figure 11:
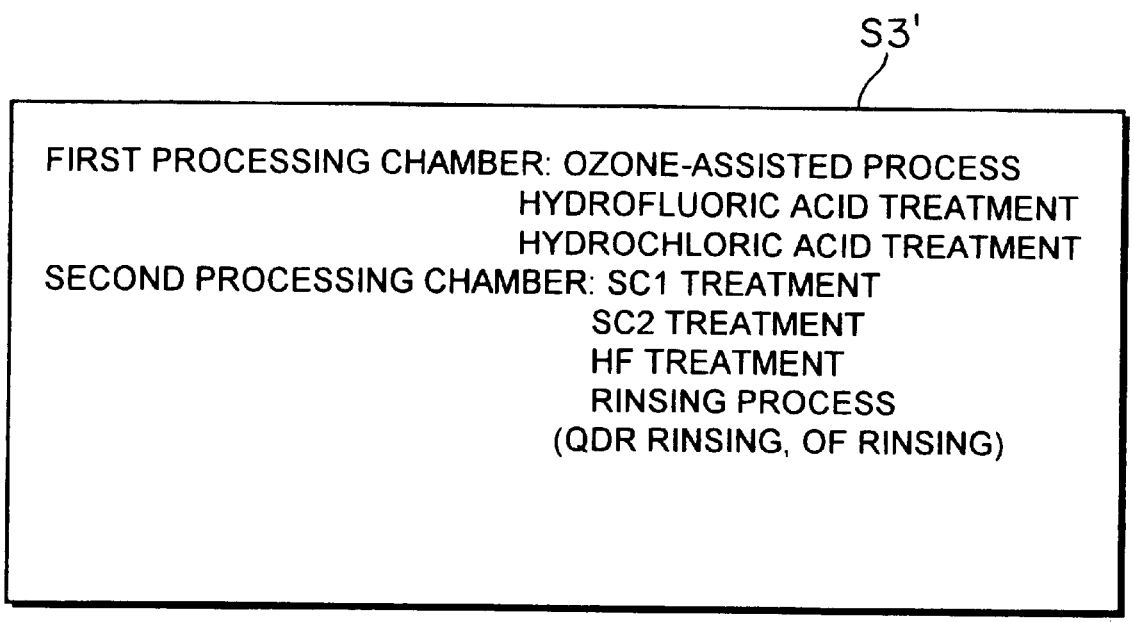
FIG. 11 is a diagram showing processes to be carried out in step S3' instead of step S3 of the substrate processing procedure shown in FIG. 8.

Basically, a cleaning method to be carried out by the substrate processing apparatus 160 thus constructed is the same as the cleaning method expressed by the flow chart shown in FIG. 8, except that the cleaning method to be carried out by the substrate processing apparatus 160 executes step S3' shown in FIG. 11 instead of step S3 after carrying wafers W into the vessel 3 in step S1 and closing the cover 21 in step S2. In the first processing chamber 2, a hydrofluoric acid vapor cleaning process using hydrofluoric acid vapor and steam (hydrofluoric acid treatment) and hydrochloric acid cleaning process using hydrochloric acid gas and steam (hydrochloric acid treatment) can be carried out in addition to an ozone-assisted cleaning process using ozone.

When carrying out the hydrofluoric acid treatment in the first processing chamber 2, steam is supplied first, and then hydrofluoric acid vapor is supplied to form a hydrofluoric acid solution film on wafers W. Natural oxide films formed on the wafers W and particles adhering to the wafers W are removed from the wafers W by the agency of radicals of fluorine atoms. Steam and hydrofluoric acid vapor may be simultaneously supplied to use radicals of fluorine atoms produced in a mixed gas of steam and hydrofluoric acid vapor for removing natural oxide films and particles from the wafers W. When carrying out the hydrochloric acid treatment, steam is supplied first, and then hydrochloric acid gas is supplied to form a hydrochloric acid solution film on the wafers W. Natural oxide films formed on the wafers W and particles adhering to the wafers W are removed from the wafers W by the agency of radicals of hydrochloric acid. Steam and hydrochloric acid vapor may be simultaneously supplied to use radicals of hydrochloric acid produced in a mixed gas of steam and hydrochloric acid vapor for removing natural oxide films and particles from the wafers W.

The SC1 treatment, the SC2 treatment, the HF treatment and the rinsing process can be carried out in the second processing chamber 4. The SC1 treatment removes organic contaminants and particles from wafers W by the agency of the APM. The SC2 treatment removes metallic impurities from wafers W by the agency of the HPM. The HF treatment removes natural oxide films and particles from wafers W by the agency of the DHF.

In step S3', those processes can be selectively carried out in a desired sequence. For example, the ozone-assisted process is carried out in the first processing chamber 2 to alter resist films into water-soluble films and the rinsing process is carried out in the second processing chamber 4. Then, hydrofluoric acid treatment is carried out in the first processing chamber 2 or the HF treatment is carried out in the second processing chamber 4 to clean the wafers W of impurities by etching the surfaces of wafers W of silicon. Then, the rinsing process is carried out in the second processing chamber 4 and, finally, a drying process is carried out in the first processing chamber 2. The substrate processing apparatus 160 can be used for specific wafer processing. For example, the hydrofluoric acid treatment is carried out in the first processing chamber 2, and then the rinsing process and the drying process are carried out. It is possible to carry out the SC1 treatment, the rinsing process, the SC2 treatment, the rinsing process, the HF treatment and the rinsing process successively in the second processing chamber 4, and to carry out the drying process finally in the first processing chamber 2.

The APM is drained through the APM drain pipe-line 201 after the completion of the SC1 treatment, THE HPM is drained through the HPM drain pipe-line 203 after the completion of the SC2 treatment, and the DHF is drained through the DHF drain pipe-line 205 after the completion of the HF treatment. Since the different processing liquids are drained through the individual drain pipe-lines, cross-contamination, i.e. the production of contaminants, such as salts, by the mixing of, for example, an acidic substance and an alkaline substance in a pipe forming the drain pipe-line can be prevented.

The substrate processing apparatus 160 is capable of carrying out a plurality of chemical liquid cleaning processes (liquid treatments) and a plurality of vapor cleaning processes (processes each using a processing gas and steam) in combination by using a floor space for one processing chamber. Thus, the substrate processing apparatus 160 is capable of further efficiently using floor space. During the process, $N_2$ gas can be continuously supplied to carry out the processes properly in an $N_2$ atmosphere. The substrate processing apparatus 160, similarly to the substrate processing apparatus 1, is capable of preventing the exposure of wafers to air outside the substrate processing apparatus 160.

Although the invention has been described in its preferred embodiments, the present invention is not limited thereto in its practical application and various modifications are possible. It is effective to activate an oxidizing reaction through the promotion of the production of radicals of oxygen atoms in the liquid film by supplying a small amount of a catalyst gas, such as $NO_x$ gas, into the vessel 3.

The processing gas may be subjected to an excitation reaction to make radicals grow. The cleaning process can be promoted by supplying ozone gas containing radicals of oxygen atoms, chlorine gas containing radicals of chlorine atoms and fluorine gas containing radicals of fluorine atoms to produce an increased quantity of radicals.

The present invention can be applicable not only to a substrate processing apparatus that processes a plurality of substrates in a batch but also to a substrate processing apparatus that processes substrates one at a time. The substrates are not limited to wafers W and may be CD substrates, printed wiring boards and ceramic substrates.

What is claimed is:

1. A substrate processing apparatus for processing a substrate by a plurality of processes, comprising:
   a first processing chamber for containing the substrate;
   a second processing chamber for containing the substrate, adjoining the first processing chamber and capable of being connected to the first processing chamber;

a supporting member for supporting the substrate so as to carry the substrate between the first processing chamber and the second processing chamber;

a solvent vapor supply port through which solvent vapor is supplied into the first processing chamber;

a processing gas supply port through which a processing gas is supplied into the first processing chamber;

a drying gas supply port through which a drying gas is supplied into the first processing chamber; and a processing liquid supply port through which a processing liquid is supplied into the second processing chamber.

2. The substrate processing apparatus according to claim 1, wherein:

the solvent vapor supplied through the solvent vapor supply port is a steam, the processing gas supplied through the processing gas supply port is an ozone gas, the drying gas supplied through the drying gas supply port is a gas containing IPA vapor, and the processing liquid supplied through the processing liquid supply port is a water.

3. The substrate processing apparatus according to claim 1, further comprising:

a vessel forming therein the first processing chamber and the second processing chamber; and an exhaust pipe-line to exhaust at least an atmosphere in the vessel.

4. The substrate processing apparatus according to claim 1, wherein an inert gas pipe-line is connected to the processing gas supply port so as to supply the inert gas from the processing gas supply port into the first processing chamber.

5. The substrate processing apparatus according to claim 4, wherein at least one of the solvent vapor, the processing gas and the drying gas is purged from the first processing chamber by the inert gas supplied through the inert gas pipe-line so that an atmosphere in the first processing chamber is displaced.

6. The substrate processing apparatus according to claim 1, wherein the second processing chamber is formed below the first processing chamber.

7. The substrate processing apparatus according to claim 6, wherein an exhaust pipe-line is connected to the first processing chamber so as to exhaust the atmosphere in the first processing chamber.

8. The substrate processing apparatus according to claim 7, wherein a flow control valve is provided in the exhaust pipe-line so as to control a flow rate of the atmosphere exhausted through the exhaust pipe-line to regulate a pressure in the first processing chamber.

9. The substrate processing apparatus according to claim 6, further comprising a movable partition disposed between the first processing chamber and the second processing chamber and capable of being opened and closed.

10. The substrate processing apparatus according to claim 1, further comprising a movable partition disposed between the first processing chamber and the second processing chamber, and capable of being opened and closed.

11. The substrate processing apparatus according to claim 1, wherein a plurality of processing gas supply pipe-lines through which different processing gases are supplied, respectively, are connected to the processing gas supply port.

12. The substrate processing apparatus according to claim 11, wherein an inert gas pipe-line is connected to the processing gas supply port so as to supply the inert gas from the processing gas supply port into the first processing chamber.

13. The substrate processing apparatus according to claim 1, wherein a plurality of processing liquid supply pipe-lines through which different processing liquids are supplied, respectively, are connected to the processing liquid supply port.

14. The substrate processing apparatus according to claim 13, further comprising a plurality of draining pipe-lines to drain different processing liquids, respectively, from the second processing chamber.

15. A substrate processing apparatus for processing a substrate, on which a resist film is formed, comprising:

a first processing chamber for a process of altering the resist film on the substrate into a water-soluble film;

a second processing chamber for a process of rinsing the water-soluble film on the substrate with a water, capable of being connected to the first processing chamber;

a movable partition disposed between the first processing chamber and the second processing chamber, and capable of being opened and closed; and a supporting member for supporting the substrate so as to carry the substrate between the first processing chamber and the second processing chamber.

16. The substrate processing apparatus according to claim 15, further comprising:

a steam generator connected to the first processing chamber; and an ozone gas generator connected to the first processing chamber.

17. The substrate processing apparatus according to claim 16, wherein the steam generator is connected to the first processing chamber through a steam supply pipe-line provided with a ribbon heater.

* * * * *